(12) United States Patent
Shin et al.

(10) Patent No.: US 12,153,254 B2
(45) Date of Patent: *Nov. 26, 2024

(54) OPTICAL ISOLATOR AND PHOTONIC INTEGRATED CIRCUIT INCLUDING THE SAME

(71) Applicant: SAMSUNG ELECTRONICS CO., LTD., Suwon-si (KR)

(72) Inventors: Dongjae Shin, Seoul (KR); Hyunil Byun, Seongnam-si (KR); Jinmyoung Kim, Hwaseong-si (KR); Changgyun Shin, Anyang-si (KR); Changbum Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/114,772

(22) Filed: Feb. 27, 2023

(65) Prior Publication Data

US 2023/0228938 A1    Jul. 20, 2023

Related U.S. Application Data

(63) Continuation of application No. 17/357,503, filed on Jun. 24, 2021, now Pat. No. 11,630,262.

(30) Foreign Application Priority Data

Jan. 15, 2021    (KR) ........................ 10-2021-0006283

(51) Int. Cl.
  *G02B 6/12* (2006.01)
  *G01S 7/481* (2006.01)
  *G01S 17/88* (2006.01)

(52) U.S. Cl.
  CPC ........ *G02B 6/12016* (2013.01); *G01S 7/4818* (2013.01); *G01S 17/88* (2013.01);
  (Continued)

(58) Field of Classification Search
  CPC ................... G02B 2006/12157; H01S 5/0064
  See application file for complete search history.

(56) References Cited

U.S. PATENT DOCUMENTS 5,317,448 A   5/1994  Nobuhara
6,980,345 B2  12/2005 Kim
(Continued)

FOREIGN PATENT DOCUMENTS

EP    2843853 A1    3/2015
JP    2002277826 A  9/2002
(Continued)

OTHER PUBLICATIONS

Communication dated Jan. 21, 2022 issued by the European Patent Office in European Application No. 21183168.0.
(Continued)

*Primary Examiner* — Charlie Y Peng
(74) *Attorney, Agent, or Firm* — Sughrue Mion, PLLC

(57) ABSTRACT

Provided is an optical isolator including a semiconductor substrate, an optical attenuator and an optical amplifier aligned with each other on the semiconductor substrate, an input optical waveguide connected to the optical attenuator, and an output optical waveguide connected to the optical amplifier, wherein a gain of the optical amplifier decreases based on an intensity of light incident on the optical amplifier increasing, wherein a first input light incident on the optical attenuator through the input optical waveguide is output as a first output light through the output optical waveguide, and a second input light incident on the optical amplifier through the output optical waveguide is output as a second output light through the input optical waveguide, and wherein when an intensity of the first input light and an
(Continued)

intensity of the second input light are equal, an intensity of the first output light is greater than an intensity of the second output light.

20 Claims, 24 Drawing Sheets

(52) U.S. Cl.
CPC .............. *G02B 2006/12035* (2013.01); *G02B 2006/12157* (2013.01)

(56) References Cited

U.S. PATENT DOCUMENTS

| | | | |
|---|---|---|---|
| 7,012,742 | B2 | 3/2006 | Lee et al. |
| 7,164,822 | B2 * | 1/2007 | Arakawa ................. H01S 3/063 |
| | | | 385/41 |
| 7,245,644 | B2 | 7/2007 | Kang et al. |
| 11,630,262 | B2 * | 4/2023 | Shin ...................... H01S 5/0265 |
| | | | 385/140 |
| 2004/0079961 | A1 | 4/2004 | Taylor et al. |
| 2011/0079704 | A1 | 4/2011 | Yu et al. |
| 2014/0064306 | A1 * | 3/2014 | Yoon ....................... H01S 5/026 |
| | | | 372/20 |
| 2014/0247477 | A1 | 9/2014 | Duan et al. |
| 2016/0079730 | A1 * | 3/2016 | Teranishi .............. H01S 5/0683 |
| | | | 359/344 |
| 2019/0025614 | A1 | 1/2019 | Teranishi |
| 2019/0227150 | A1 | 7/2019 | Shin |
| 2019/0288132 | A1 | 9/2019 | Wang et al. |
| 2020/0112291 | A1 | 4/2020 | Lee et al. |

FOREIGN PATENT DOCUMENTS

| | | |
|---|---|---|
| KR | 10-0532260 B1 | 11/2005 |
| KR | 10-0547868 B1 | 1/2006 |
| KR | 10-1550502 B1 | 9/2015 |

OTHER PUBLICATIONS

Shoji et al., "Silicon Waveguide Optical Isolator with Directly Bonded Magneto-Optical Garnet," MDPI, Applied Sciences 9, 609, Feb. 12, 2019, (8 pages).

Yang et al., "Inverse-designed non-reciprocal pulse router for chip-based LiDAR," Nature Photonics, Mar. 23, 2020, (7 pages).

Zhang, Z., et al., "High-Speed Coherent Optical Communication With Isolator-Free Heterogeneous Si/III-V Lasers", Journal of Lightwave Technology, vol. 38, No. 23, Dec. 1, 2020, pp. 6584-6590.

* cited by examiner

OPTICAL ISOLATOR AND PHOTONIC INTEGRATED CIRCUIT INCLUDING THE SAME

CROSS-REFERENCE TO RELATED APPLICATION

This application is a continuation of U.S. application Ser. No. 17/357,503. Filed Jun. 24, 2021, which is based on and claims priority under 35 U.S.C. § 119 to Korean Patent Application No. 10-2021-0006283, filed on Jan. 15, 2021 in the Korean Intellectual Property Office, the disclosure of which is incorporated by reference herein in its entirety.

BACKGROUND

1. Field

Example embodiments of the present disclosure relate to optical isolators capable of being integrated into a photonic integrated circuit, and photonic integrated circuits including the optical isolators.

2. Description of Related Art

A photonic integrated circuit (PIC) in which a variety of optical elements are integrated is being used in various optical sensors or optical connection fields. An optical element used in a photonic integrated circuit may include, for example, a light source converting electrical energy into light energy, a light modulator that modulates light, an optical waveguide transmitting an optical signal, an optical antenna or optical coupler that emits light inside an optical waveguide to the outside of a photonic integrated circuit chip or receives light from outside the photonic integrated circuit chip into the optical waveguide, an optical receiver that converts optical energy into electrical energy, etc. The optical elements integrated in the photonic integrated circuit mostly include a material that is easy to form on a substrate.

On the other hand, an optical isolator is an optical element that guides light in only one direction in an optical system similar to a diode for flowing a current in one direction in an electronic circuit. An optical isolator used in bulk optical systems include a polarizing rotator arranged between two polarizers having different polarization directions from each other. However, because a material used as a polarizing rotator is not compatible with a semiconductor process, it is difficult to integrate an optical isolator that uses a polarization rotation principle into a photonic integrated circuit, and thus, mass production is very difficult. Recently, an optical isolator using nonlinearity of a silicon waveguide has been proposed. However, such an optical isolator may only be used in a very narrow wavelength band because the optical isolator uses a principle whereby a resonance wavelength of a resonator varies according to the direction in which light travels.

SUMMARY

One or more example embodiments provide optical isolators that may be integrated into photonic integrated circuits and photonic integrated circuits including the optical isolators.

One or more example embodiments also provide optical isolators that may be operated in a wide wavelength band and photonic integrated circuits including the optical isolators.

Additional aspects will be set forth in part in the description which follows and, in part, will be apparent from the description, or may be learned by practice of example embodiments.

According to an aspect of an example embodiment, there is provided an optical isolator including a semiconductor substrate, an optical attenuator and an optical amplifier provided on the semiconductor substrate, an input optical waveguide connected to the optical attenuator, and an output optical waveguide connected to the optical amplifier, wherein a gain of the optical amplifier decreases based on an intensity of light incident on the optical amplifier increasing, wherein a first input light incident on the optical attenuator through the input optical waveguide is output as a first output light through the output optical waveguide, and a second input light incident on the optical amplifier through the output optical waveguide is output as a second output light through the input optical waveguide, and wherein when an intensity of the first input light and an intensity of the second input light are equal, an intensity of the first output light is greater than an intensity of the second output light.

Each of the optical attenuator and the optical amplifier may include a semiconductor material having a direct bandgap.

A carrier density of the semiconductor material included in the optical attenuator may be less than a transparency carrier density, and a carrier density of the semiconductor material included in the optical amplifier may be greater than the transparency carrier density.

The optical isolator may further include a waveguide layer provided on the semiconductor substrate, the input optical waveguide and the output optical waveguide may be included in the waveguide layer, and the optical attenuator and the optical amplifier may be provided on the waveguide layer.

The input optical waveguide and the output optical waveguide may respectively continuously extend in the waveguide layer in a traveling direction of light.

The input optical waveguide and the output optical waveguide may be spaced apart from each other, the input optical waveguide may have a tapered end provided under the optical attenuator, and the output optical waveguide may have a tapered end provided under the optical amplifier.

The semiconductor substrate may include a semiconductor layer and a dielectric layer that is provided over an entire area of an upper surface of the semiconductor layer.

The semiconductor substrate may include a semiconductor layer and a dielectric layer that is provided over a partial area of an upper surface of the semiconductor layer in a traveling direction of light, the dielectric layer faces the optical attenuator and the optical amplifier in a region between the semiconductor layer and the waveguide layer.

The optical attenuator and the optical amplifier may respectively include a first contact layer provided on the waveguide layer, a gain material layer provided on the first contact layer, a clad semiconductor layer provided on the gain material layer, and a second contact layer provided on the clad semiconductor layer.

The first contact layer of the optical attenuator may be integrally formed with the first contact layer of the optical amplifier, and the first contact layer of the optical attenuator and the first contact layer of the optical amplifier may extend in a traveling direction of light.

The gain material layer, the clad semiconductor layer, and the second contact layer included in the optical attenuator may be separated from the gain material layer, the clad semiconductor layer, and the second contact layer included the optical amplifier.

The optical attenuator and the optical amplifier may include a first electrode provided on the first contact layer of the optical attenuator and the first contact layer of the optical amplifier, and the optical attenuator may include a second electrode provided on the second contact layer of the optical attenuator and the optical amplifier includes a second electrode provided on the second contact layer of the optical amplifier.

Lengths of the gain material layer, the clad semiconductor layer, and the second contact layer included the optical amplifier in the traveling direction of light may be greater than lengths of the gain material layer, the clad semiconductor layer, and the second contact layer included the optical attenuator in the traveling direction of light.

The gain material layer included in the optical attenuator may be configured to absorb light based on a backward voltage being applied to the gain material layer included in the optical attenuator, and amplify light based on a forward voltage being applied to the gain material layer included in the optical amplifier.

A voltage that allows the carrier density to be less than the transparency carrier density in the gain material layer of the optical attenuator may be applied to the gain material layer included in the optical attenuator, and a voltage that allows the carrier density to be greater than the transparency carrier density in the gain material layer of the optical amplifier may be applied to the gain material layer included in the optical amplifier.

Each of the optical attenuator and the optical amplifier may have a rib-type waveguide shape in which a width of the first contact layer in a direction perpendicular to the traveling direction of light is greater than widths of the gain material layer, the clad semiconductor layer, and the second contact layer.

Both sides of the first contact layer, the gain material layer, the clad semiconductor layer, and the second contact layer in the traveling direction of light may have tapered ends.

The first contact layer, the gain material layer, the clad semiconductor layer, and the second contact layer included in the optical attenuator may be separated from the first contact layer, the gain material layer, the clad semiconductor layer, and the second contact layer included in the optical amplifier.

The optical attenuator may include a first optical attenuator and a second optical attenuator, the optical amplifier may include a first optical amplifier and a second optical amplifier, and the first optical attenuator, the first optical amplifier, the second optical attenuator, and the second optical amplifier may be provided in that order in the traveling direction of light.

When the intensity of the first input light and the intensity of the second input light are equal, the intensity of the first output light is 1000 times or more greater than the intensity of the second output light.

According to another aspect of an example embodiment, there is provided a photonic integrated circuit including an optical isolator configured to integrate through a semiconductor manufacturing process, the optical isolator including a semiconductor substrate, an optical attenuator and an optical amplifier provided on the semiconductor substrate, an input optical waveguide connected to the optical attenuator, and an output optical waveguide connected to the optical amplifier, wherein a gain of the optical amplifier decreases based on an intensity of input light increasing, wherein a first input light incident on the optical attenuator through the input optical waveguide is output as a first output light through the output optical waveguide, and a second input light incident on the optical amplifier through the output optical waveguide is output as a second output light through the input optical waveguide, and wherein, when the intensity of the first input light and the intensity of the second input light are equal, an intensity of the first output light is greater than an intensity of the second output light.

According to yet another aspect of an example embodiment, there is provided a light detection and ranging apparatus including a light source, a photodetector, an antenna connected to the light source and the photodetector, the antenna being configured to emit light to an outside or receive light from the outside, and an optical isolator connected between the light source and the antenna, the optical isolator being configured to transmit light in a direction from the light source to the antenna, wherein the optical isolator includes a semiconductor substrate, an optical attenuator and an optical amplifier provided on the semiconductor substrate, an input optical waveguide connected to the optical attenuator, and an output optical waveguide connected to the optical amplifier, wherein a gain of the optical amplifier decreases based on an intensity of input light increasing, wherein a first input light incident on the optical attenuator through the input optical waveguide is output as a first output light through the output optical waveguide, and a second input light incident on the optical amplifier through the output optical waveguide is output as a second output light through the input optical waveguide, and wherein, when an intensity of the first input light and an intensity of the second input light are equal, an intensity of the first output light is greater than an intensity of the second output light.

According to yet another aspect of an example embodiment, there is an optical communication system including a first communication terminal including a first optical transmitter and a first optical receiver, a second communication terminal including a second optical transmitter and a second optical receiver, an optical waveguide connecting the first communication terminal to the second communication terminal, a first optical isolator configured to transmit light in a direction from the first optical transmitter of the first communication terminal to the optical waveguide, and a second optical isolator configured to transmit light in a direction from the second optical transmitter of the second communication terminal to the optical waveguide, wherein each of the first optical isolator and the second optical isolator include a semiconductor substrate, an optical attenuator and an optical amplifier provided on the semiconductor substrate, an input optical waveguide connected to the optical attenuator, and an output optical waveguide connected to the optical amplifier, wherein a gain of the optical amplifier decreases based on an intensity of input light increasing, wherein first input light incident on the optical attenuator through the input optical waveguide is output as a first output light through the output optical waveguide, and a second input light incident on the optical amplifier through the output optical waveguide is output as a second output light through the input optical waveguide, and wherein, when an intensity of the first input light and an intensity of the second input light are equal, an intensity of the first output light is greater than an intensity of the second output light.

According to yet another aspect of an example embodiment, there is an optical isolator including a semiconductor substrate, an optical attenuator provided on the semiconductor substrate, an optical amplifier provided on the semiconductor substrate and adjacent to the optical attenuator, an input optical waveguide provided adjacent to the optical attenuator opposite to the optical amplifier, and an output optical waveguide provided adjacent to the optical amplifier opposite to the optical attenuator, wherein a gain of the optical amplifier decreases based on an intensity of light incident on the optical amplifier increasing.

BRIEF DESCRIPTION OF THE DRAWINGS

The above and/or other aspects, features, and advantages of certain example embodiments will be more apparent from the following description taken in conjunction with the accompanying drawings, in which.

DETAILED DESCRIPTION

Figure 1:
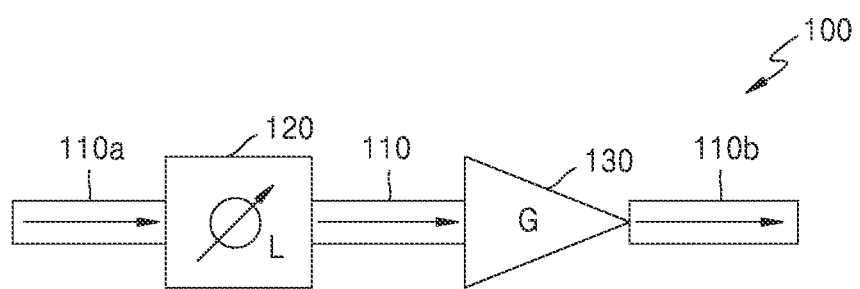
FIG. 1 is a conceptual diagram showing a configuration of an optical isolator according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, an optical isolator and a photonic integrated circuit including the optical isolator will be described in detail with reference to the accompanying drawings. In the drawings, like reference numerals refer to the like elements, and sizes of elements may be exaggerated for clarity and convenience of explanation. The embodiments described below are merely illustrative, and various modifications may be possible from the example embodiments of the present disclosure.

When an element or layer is referred to as being "on" or "above" another element or layer, the element or layer may be directly on another element or layer or intervening elements or layers. The singular forms are intended to include the plural forms as well, unless the context clearly indicates otherwise. Also, when a region "includes" an element, the region may further include another element instead of excluding the other element, unless otherwise differently stated.

The term "above" and similar directional terms may be applied to both singular and plural. With respect to operations that constitute a method, the operations may be performed in any appropriate sequence unless the sequence of operations is clearly described or unless the context clearly indicates otherwise. The operations may not necessarily be performed in the order of sequence.

Also, in the specification, the term "units" or " . . . modules" denote units or modules that process at least one function or operation, and may be realized by hardware, software, or a combination of hardware and software.

In addition, connections or connection members of lines between components shown in the drawings illustrate functional connections and/or physical or circuit connections, and the connections or connection members can be represented by replaceable or additional various functional connections, physical connections, or circuit connections in an actual apparatus.

The use of all examples or illustrative terms is merely for describing technical concepts in detail, and the inventive concept is not limited by these examples or illustrative terms unless limited by the claims.

FIG. 1 is a conceptual diagram showing a configuration of an optical isolator 100 according to an example embodiment. Referring to FIG. 1, the optical isolator 100 according to an example embodiment may include an optical waveguide 110, an optical attenuator 120, and an optical amplifier 130. The optical attenuator 120 and the optical amplifier 130 may be arranged in a line and aligned with each other along the optical waveguide 110. The optical waveguide 110 may include an input optical waveguide 110a connected to the optical attenuator 120 and an output optical waveguide 110b connected to the optical amplifier 130.

The optical attenuator 120 and the optical amplifier 130 may include a semiconductor material, for example, a Group III/V compound semiconductor or a Group II/VI compound semiconductor. The optical attenuator 120 is configured to output input light by attenuating the intensity of input light, and the optical amplifier 130 is configured to output the input light by amplifying the intensity of the input light.

The optical isolator 100 according to the example embodiment uses gain saturation characteristics of a semiconductor optical amplifier (SOA) including a semiconductor material. The gain saturation is a phenomenon where a gain of the semiconductor optical amplifier rapidly decreases when the intensity of input light increases. The gain saturation phenomenon is a general characteristic of a semiconductor gain material. For example, a gain change of the semiconductor optical amplifier may be modeled with the following Equation 1.

$$g = \frac{g_0}{1 + P/P_s} \quad \text{[Equation 1]}$$

In Equation 1, g is an actual gain of a semiconductor optical amplifier, g0 is a maximum gain of the semiconductor optical amplifier, P is the intensity of input light, and the Ps is the intensity of the input light at which a gain saturation occurs.

Figure 2:
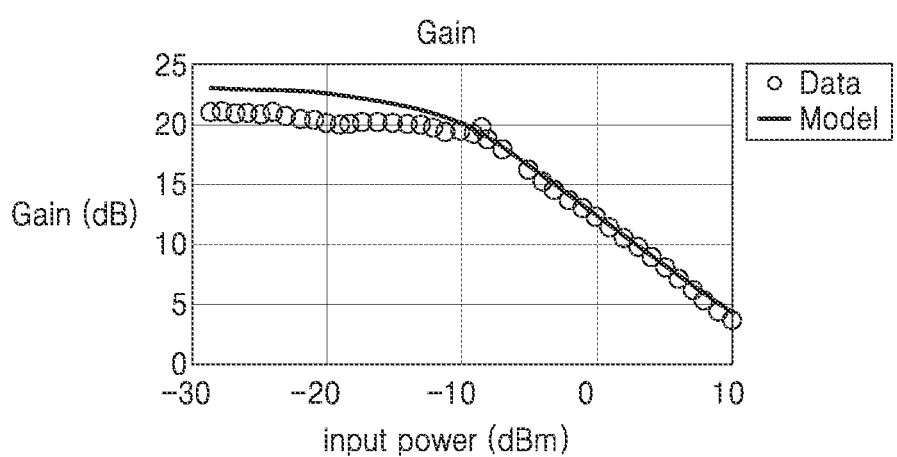
FIG. 2 is a graph illustrating gain saturation characteristics of an optical amplifier used in the optical isolator shown in FIG. 1.

FIG. 2 is a graph illustrating gain saturation characteristics of the optical amplifier 130 used in the optical isolator 100 shown in FIG. 1. Referring to FIG. 2, the solid line represents a predictive gain change modeled with Equation 1, and the circles represent a measured gain. It may be seen that the gain change according to the intensity of input light of the optical amplifier 130 including a semiconductor material substantially matches the prediction modeled with Equation 1.

Due to a gain saturation phenomenon, light input of low intensity gains a high gain and light input of high intensity gains a low gain. Accordingly, if the intensity of input light is controlled to be different according to the direction in which the light is input, different gains may be obtained according to the direction. As shown in FIG. 1, the same operation described above may be implemented by connecting the optical attenuator 120 and the optical amplifier 130 in a line.

Figure 3:
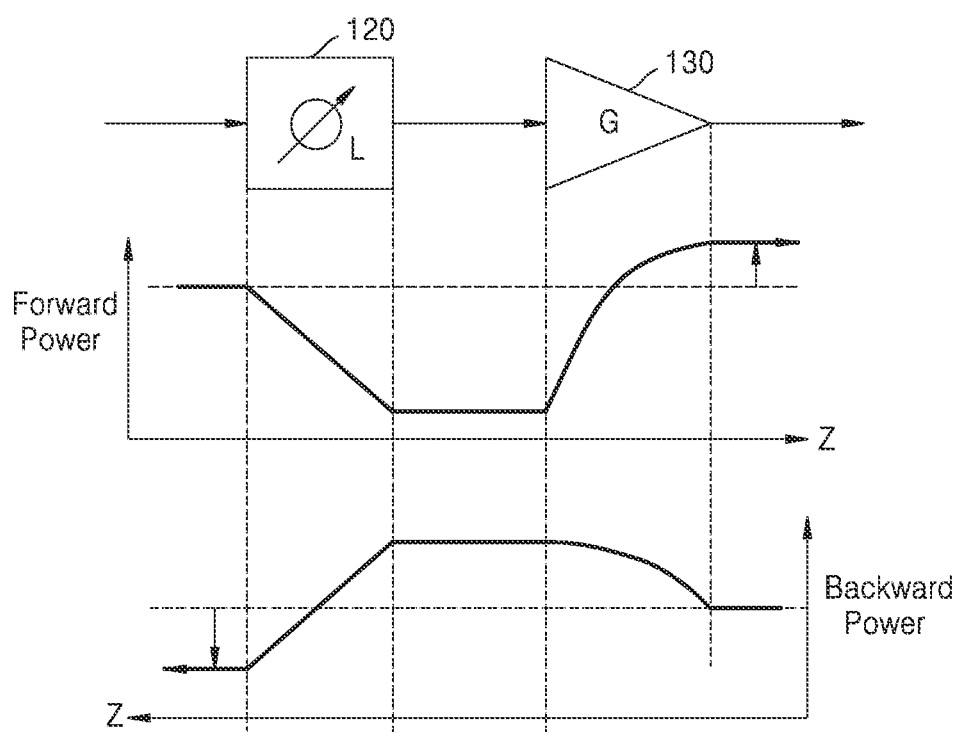
FIG. 3 shows operation characteristics of an optical isolator when an optical attenuator has a linear attenuation characteristic.

FIG. 3 shows operation characteristics of the optical isolator 100 when the optical attenuator 120 has a linear attenuation characteristic. First, when a forward input light is input, forward input light first enters the optical attenuator 120 through the input optical waveguide 110a, passes through the optical amplifier 130, and is output as forward output light through the output optical waveguide 110b. The intensity of the forward input light is linearly reduced while firstly passing through the optical attenuator 120. Accordingly, because the forward input light of a low intensity is input to the optical amplifier 130, the forward output light obtains a higher gain from the optical amplifier 130 and is output from the optical isolator 100. As a result, the intensity of the forward output light becomes greater than the intensity of the forward input light as indicated by an upward arrow in FIG. 3.

When a backward input light is input, backward input light first enters the optical amplifier 130 through the output optical waveguide 110b, passes through the optical attenuator 120, and is output through as backward output light through the input optical waveguide 110a. The backward input light that is not attenuated by the optical attenuator 120 and has a greater intensity than the forward input light enters the optical amplifier 130, and thus, the backward input light obtains a relatively low gain in the optical amplifier 130. Afterwards, the intensity of the backward input light is linearly reduced by passing through the optical attenuator 120, and is output as the backward output light. As a result, the intensity of the backward output light becomes less than the intensity of the backward input light as indicated by a downward arrow in FIG. 3.

A total gain of the optical isolator 100 including the optical attenuator 120 and the optical amplifier 130, is equal to a sum of an attenuation rate of the optical attenuator 120 and a gain of the optical amplifier 130. In the case of forward input light, as the attenuation rate of the optical attenuator 120 increases, the gain of the optical amplifier 130 increases, and the total gain of the optical isolator 100 is the sum of the attenuation rate of the optical attenuator 120 and the high gain of the optical amplifier 130. In the case of backward input light, a total gain of the optical isolator 100 is equal to a sum of a low gain of the optical amplifier 130 and the attenuation rate of the optical attenuator 120. Therefore, the optical isolation 100 obtains a high gain with respect to a forward light input compared to a backward light input. For example, when the intensity of the forward input light and the intensity of the backward input light are the same, the intensity of the forward output light becomes greater than the intensity of the backward output light. For example, a difference between the intensity of the forward output light and the intensity of the backward output light may be equal to a sum of the height of the upward arrow indicated on the forward output light and the height of the downward arrow indicated on the backward output light in FIG. 3.

Figure 4:
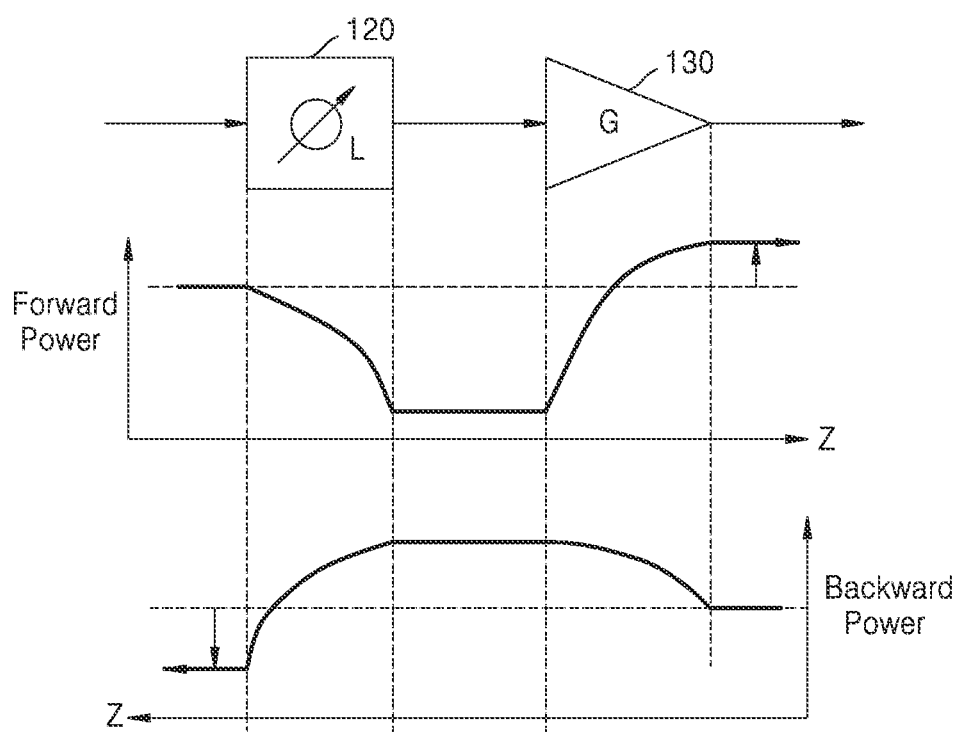
FIG. 4 shows operation characteristics of an optical isolator when an optical attenuator has a nonlinear attenuation characteristic.

Also, FIG. 4 shows operation characteristics of the optical isolator 100 when the optical attenuator 120 has a nonlinear attenuation characteristic. Referring to FIG. 4, even when the optical attenuator 120 has a nonlinear attenuation characteristic, the same or similar result as when the optical attenuator 120 has a linear attenuation may be obtained. For example, the linearity or nonlinearity of the optical attenuator 120 does not substantially affect the characteristics of the optical isolator 100, and only the attenuation rate of the optical attenuator 120 affects the characteristics of the optical isolator 100.

Figure 5:
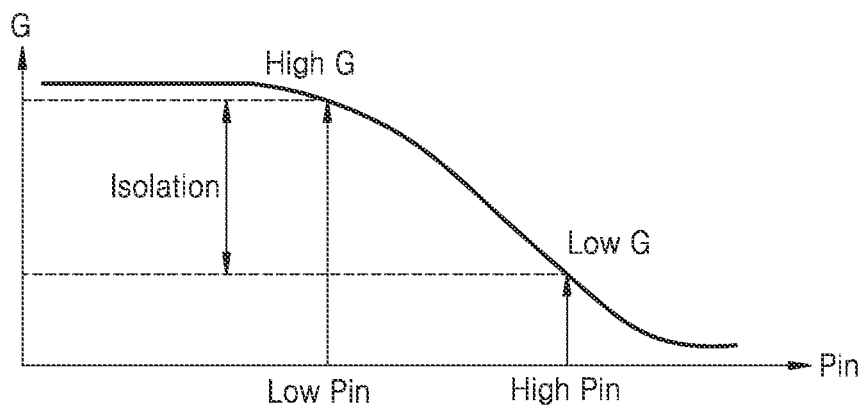
FIG. 5 is a graph illustrating a relationship between gain change of an optical amplifier and optical isolation performance of an optical isolator.

FIG. 5 is a graph showing a relationship between a gain change of the optical amplifier 130 and an optical isolation performance of the optical isolator 100. Referring to FIG. 5, the greater the difference between a relatively high gain of the optical amplifier 130 with respect to a relatively low optical input and a relatively low gain of the optical amplifier 130 with respect to a relatively high optical input, the optical isolation performance of the optical isolator 100 may be increased. As described above, the greater the attenuation rate of the optical attenuator 120, the gain of the optical amplifier 130 with respect to the forward input light increases, and the backward input light may be significantly attenuated. Accordingly, the optical isolation performance of the optical isolator 100 may be determined by the attenuation rate of the optical attenuator 120 and a gain change width of the optical amplifier 130.

Figure 6:
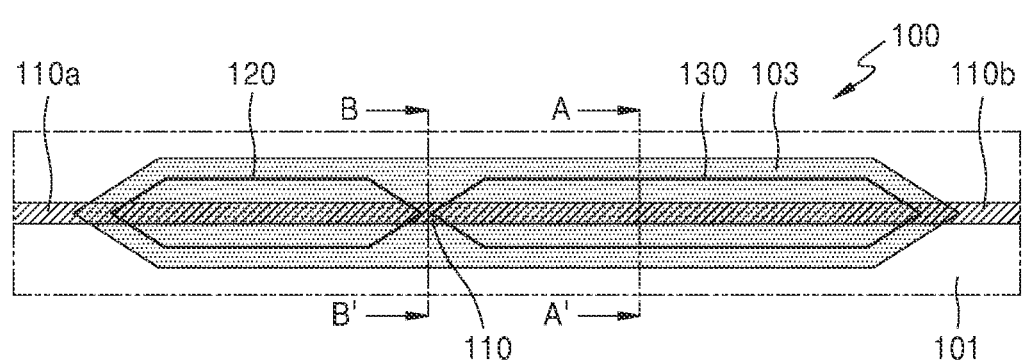
FIG. 6 is a plan view showing a configuration of an optical isolator according to an example embodiment.
Figure 7:
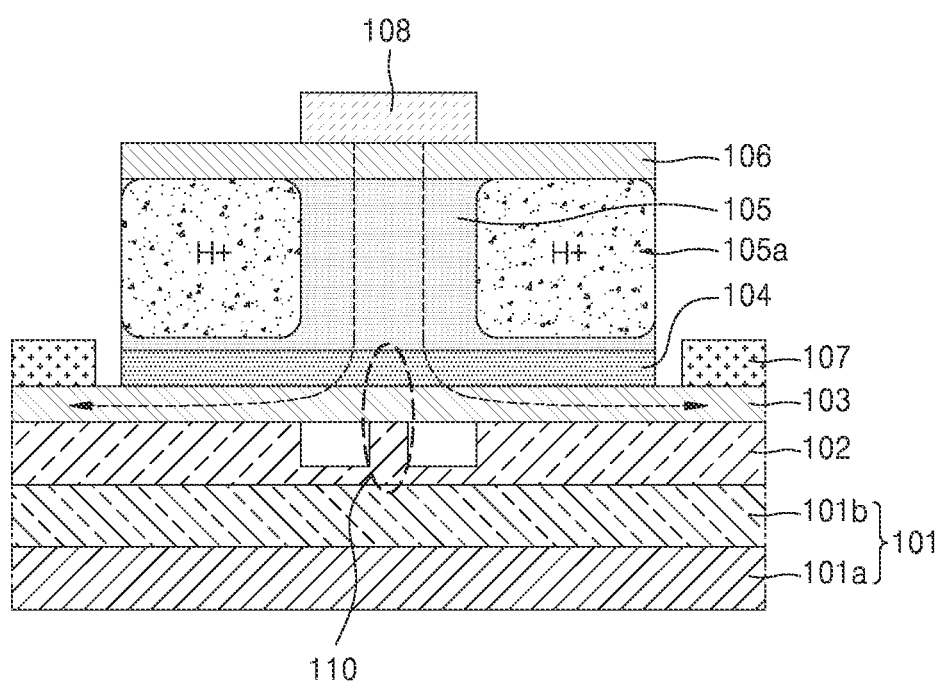
FIG. 7 is a vertical cross-sectional view of the optical isolator of FIG. 6 taken along line A-A' in FIG. 6, according to an example embodiment.

FIG. 6 is a plan view showing a configuration of the optical isolator 100 according to an example embodiment, and FIG. 7 is a vertical cross-sectional view of the optical isolator of FIG. 6 taken along line A-A' in FIG. 6, according to an example embodiment. Referring to FIG. 6, the optical isolator 100 may include a semiconductor substrate 101, an optical waveguide 110 continuously extending on the semiconductor substrate 101, an optical attenuator 120 and an optical amplifier 130 arranged in a line along the optical waveguide 110 on the semiconductor substrate 101. At both ends of the optical waveguide 110, an input optical waveguide 110a and an output optical waveguide 110b are arranged.

Referring to FIG. 7, the semiconductor substrate 101 may include a semiconductor layer 101a and a dielectric layer 101b arranged on the semiconductor layer 101a. For example, the semiconductor layer 101a may include silicon and the dielectric layer 101b may include silicon oxide (SiO$_2$), but embodiments are not limited thereto. The dielectric layer 101b may be arranged over an entire region of an upper surface of the semiconductor layer 101a. For example, the semiconductor substrate 101 may include a single silicon on insulator (SOI) substrate.

In addition, the optical isolator 100 may further include a waveguide layer 102 arranged on the semiconductor substrate 101. The waveguide layer 102 may be arranged on an upper surface of the dielectric layer 101b. Accordingly, the dielectric layer 101b may be arranged over an entire region between the semiconductor layer 101a and the waveguide layer 102. In the waveguide layer 102, an optical waveguide 110 formed by etching a region of an upper surface of the waveguide layer 102 is arranged. In the waveguide layer 102, the input optical waveguide 110a and the output optical waveguide 110b may continuously extend in a light proceeding direction. The dielectric layer 101b may serve as a clad confining light in the optical waveguide 110. For this purpose, the waveguide layer 102 may include a material having a greater refractive index than the dielectric layer 101b. In FIG. 7, the optical waveguide 110 is depicted as a rib type waveguide having a vertical protrusion, but embodiments are not necessarily limited thereto. For example, the optical waveguide 110 may be a rib-type waveguide having a plurality of vertical protrusions, or may be a channel-type waveguide without a protrusion.

The optical attenuator 120 and the optical amplifier 130 may be arranged on the waveguide layer 102. FIG. 7 shows only a cross-section of the optical amplifier 130, but the optical attenuator 120 and the optical amplifier 130 may have the same structure. As shown in FIG. 7, both the optical attenuator 120 and the optical amplifier 130 may include a first contact layer 103 arranged on the waveguide layer 102, a gain material layer 104 arranged on the first contact layer 103, a clad semiconductor layer 105 arranged on the gain material layer 104, a second contact layer 106 arranged on the clad semiconductor layer 105, a first electrode 107 arranged on the first contact layer 103, and a second electrode 108 arranged on the second contact layer 106.

The first contact layer 103, the gain material layer 104, the clad semiconductor layer 105, and the second contact layer 106 included in the optical attenuator 120 and the optical amplifier 130 may include a semiconductor material having a direct band gap. For example, the first contact layer 103, the gain material layer 104, the clad semiconductor layer 105, and the second contact layer 106 may include a Group III/V compound semiconductor or a Group II/VI compound semiconductor.

The first contact layer 103 and the second contact layer 106 provide an ohmic contact to apply a current to the gain material layer 104. To this end, the first contact layer 103 and the second contact layer 106 may be highly doped with a conductivity type electrically opposite to each other. For example, the first contact layer 103 may be doped with an n-type and the second contact layer 106 may be doped with a p-type, or the first contact layer 103 may be doped with a p-type and the second contact layer 106 may be doped with an n-type.

The gain material layer 104 may absorb light or amplify light according to an applied current. For example, the gain material layer 104 may include a multiple quantum well (MQW) structure in which a plurality of barriers and a plurality of quantum wells are alternately stacked in a vertical direction. When a current is applied to the gain material layer 104 in a forward direction, the gain material layer 104 may amplify light. When a current is applied to the gain material layer 104 in a backward direction, the gain material layer 104 may absorb light. Accordingly, depending on a direction of a current applied to the gain material layer 104, the structure shown in FIG. 7 may operate as the optical attenuator 120 or as the optical amplifier 130.

The clad semiconductor layer 105 may provide a carrier to or remove a carrier from the gain material layer 104. For example, when a forward current is applied to the clad semiconductor layer 105, a carrier density in the gain material layer 104 may be increased, and when a backward current is applied to the clad semiconductor layer 105, a carrier density in the gain material layer 104 may be reduced. In addition, the clad semiconductor layer 105 may act as a clad that confines light in the gain material layer 104 and the optical waveguide 110. The clad semiconductor layer 105 may be doped with the same electrical type as the second contact layer 106 arranged thereon. For example, when the second contact layer 106 is doped with a p-type, the clad semiconductor layer 105 may also be doped with the p-type, and when the second contact layer 106 is doped with an n-type, the clad semiconductor layer 105 may also be doped with an n-type.

A high resistance region 105a for concentrating a current to a central region of the clad semiconductor layer 105 may be further formed in a peripheral region of the clad semiconductor layer 105. For example, the high resistance region 105a may be formed by implanting hydrogen ions to the peripheral region of the clad semiconductor layer 105. Then, as indicated by arrows, a current may flow along the central region of the clad semiconductor layer 105 facing the optical waveguide 110.

As shown in FIG. 7, the first contact layer 103 may have a width greater than a width of the gain material layer 104, the clad semiconductor layer 105, and the second contact layer 106, which are arranged on the first contact layer 103. Here, the width may be defined in a direction perpendicular to a traveling direction of light traveling along the optical waveguide 110. Thus, an overall cross-section of the optical attenuator 120 and the optical amplifier 130 has a shape in which a lower part is relatively large and an upper part is relatively narrow. The optical attenuator 120 and the optical amplifier 130 having such a shape may have a function of a rib-type waveguide. For example, the optical attenuator 120 and the optical amplifier 130 may perform a role of absorbing or amplifying light, and also perform a role of guiding light together with the optical waveguide 110. For example, in FIG. 7, light may be guided along a region indicated by a dashed line in the form of an ellipse.

Referring to FIG. 6, the first contact layer 103 having a relatively large width is commonly arranged on the optical attenuator 120 and the optical amplifier 130. For example, the first contact layer 103 of the optical attenuator 120 continuously integrally extends with the first contact layer 103 of the optical amplifier 130 in a traveling direction of light. Accordingly, the optical attenuator 120 and the optical amplifier 130 may share one first contact layer 103. Other layers of the optical attenuator 120 and the optical amplifier 130 except for the first contact layer 103 may be separated from each other. For example, the gain material layer 104, the clad semiconductor layer 105, and the second contact layer 106 of the optical attenuator 120 and the gain material layer 104, the clad semiconductor layer 105, and the second contact layer 106 of the optical amplifier 130 may be separated from each other. Accordingly, the gain material layer 104, the clad semiconductor layer 105, and the second contact layer 106 are individually arranged in the optical attenuator 120 and the optical amplifier 130.

Figure 8:
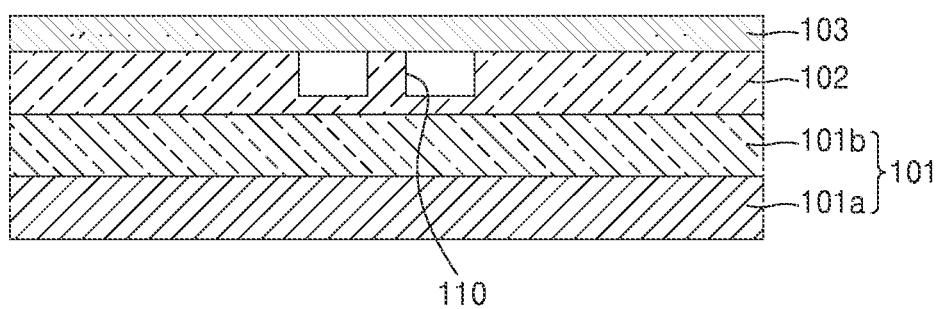
FIG. 8 is a vertical cross-sectional view of the optical isolator of FIG. 6 taken along line B-B' between the optical attenuator and the optical amplifier of the optical isolator in FIG. 6, according to an example embodiment.

Only the first contact layer 103 may exist between the optical attenuator 120 and the optical amplifier 130, and the gain material layer 104, the clad semiconductor layer 105, and the second contact layer 106 may not be present therebetween. FIG. 8 is a vertical cross-sectional view taken along line B-B' between the optical attenuator 120 and the optical amplifier 130 of the optical isolator 100 in FIG. 6, according to an example embodiment. Referring to FIG. 8, a region between the optical attenuator 120 and the optical amplifier 130 may include only the semiconductor substrate 101, the waveguide layer 102, and the first contact layer 103.

The optical attenuator 120 and the optical amplifier 130 may commonly include the first electrode 107 and individually include the second electrode 108. Accordingly, the first electrode 107 arranged on a region of an upper surface of the first contact layer 103 that is not covered by the gain material layer 104 performs as a role of a common electrode with respect to the optical attenuator 120 and the optical amplifier 130. The second electrode 108 arranged on a region of an upper surface of the second contact layer 106 may apply a voltage individually independently to the optical attenuator 120 and the optical amplifier 130. For example, when the first contact layer 103 is an n-type and the second contact layer 106 is a p-type, the first electrode 107 is a ground electrode, a negative voltage (−) may be applied to the second electrode 108 of the optical attenuator 120, and a positive voltage (+) may be applied to the second electrode 108 of the optical amplifier 130. When the first contact layer 103 is a p-type and the second contact layer 106 is an n-type, the first electrode 107 is a ground electrode, a positive voltage (+) may be applied to the second electrode 108 of the optical attenuator 120, and a negative voltage (−) may be applied to the second electrode 108 of the optical amplifier 130.

Then, a voltage may be applied to the optical attenuator 120 in a backward direction and a voltage may be applied to the optical amplifier 130 in a forward direction. The voltage applied to the second electrode 108 of the optical attenuator 120 may be selected so that a carrier density in a semiconductor material of the optical attenuator 120, in particular the carrier density in the gain material layer 104 is less than a transparency carrier density. The transparency carrier density may be a carrier density when a semiconductor material is transparent or a carrier density that makes a semiconductor material transparent. If a carrier density in a semiconductor material is less than a transparency carrier density, the semiconductor material absorbs energy from incident light. Accordingly, the optical attenuator 120 may attenuate light.

A voltage applied to the second electrode 108 of the optical amplifier 130 may be selected so that a carrier density in a semiconductor material of the optical amplifier 130, in particular, a carrier density in the gain material layer 104 is selected to be greater than a transparency carrier density. If a carrier density in the semiconductor material is greater than a transparency carrier density, light is emitted by combining electrons and holes in the semiconductor material. Accordingly, the optical attenuator 130 may amplify the light. A value of a voltage applied to the second electrode 108 of the optical attenuator 120 and the optical amplifier 130 may vary according to characteristics of the semiconductor material actually used in the optical attenuator 120 and the optical amplifier 130.

Also, referring to FIG. 6, in order for the optical amplifier 130 to have a sufficient gain, a length of the optical amplifier 130 in a traveling direction of light traveling along the optical waveguide 110 may be greater than a length of the optical attenuator 120 in a traveling direction of light. For example, lengths of the gain material layer 104, the clad semiconductor layer 105, and the second contact layer 106 included in the optical amplifier 130 may be greater than lengths of the gain material layer 104, the clad semiconductor layer 105, and the second contact layer 106 included in the optical attenuator 120.

Also, the first contact layer 103, the gain material layer 104, the clad semiconductor layer 105, and the second contact layers 106, included in the optical attenuator 120 and the optical amplifier 130 may have tapered ends on both sides in a traveling direction of light. Then, a reflection loss and reflection noise due to a rapid material change during light traveling may be reduced.

Figure 9:
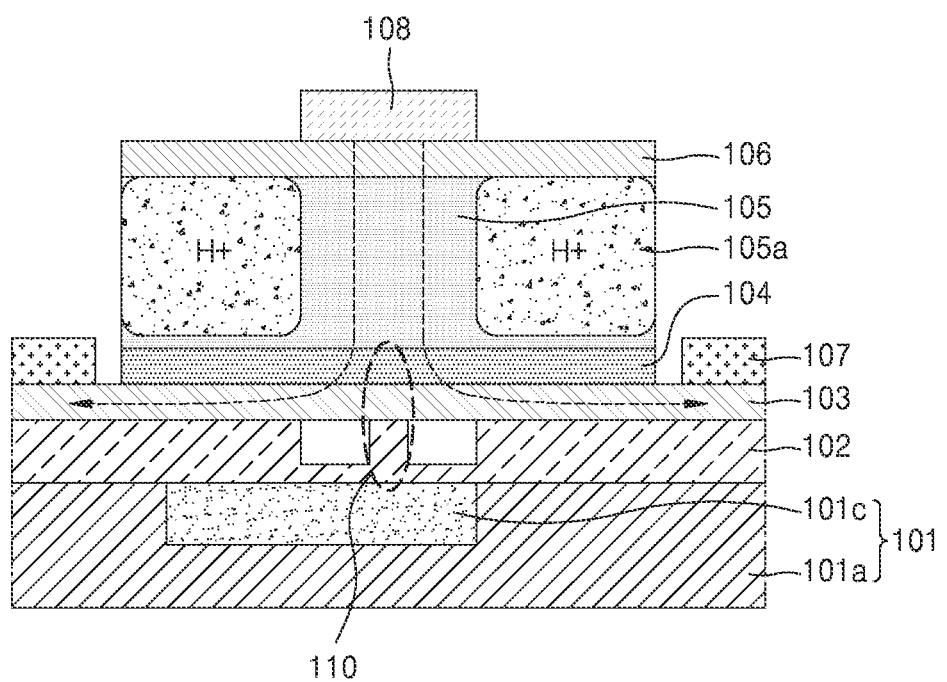
FIG. 9 is a vertical cross-sectional view of the optical isolator of FIG. 6 taken along line A-A' in FIG. 6, according to another embodiment.

In FIGS. 7 and 8, the semiconductor substrate 101 is a SOI substrate, but embodiments are not necessarily limited thereto. FIG. 9 is a vertical cross-sectional view of the optical isolator of FIG. 6 taken along line A-A' in FIG. 6, according to another example embodiment. Referring to FIG. 9, the semiconductor substrate 101 may include a semiconductor layer 101a and a dielectric layer 101c that is locally arranged in a travelling direction of light to face the optical attenuator 120 and the optical amplifier 130 in a region between the semiconductor layer 101a and the waveguide layer 102. Then, the semiconductor substrate 101 may use a bulk semiconductor substrate. For example, an upper surface of the bulk semiconductor layer 101a may be partly etched and the upper surface of the etched bulk semiconductor layer 101a may be filled with a material of the dielectric layer 101c.

Figure 10:
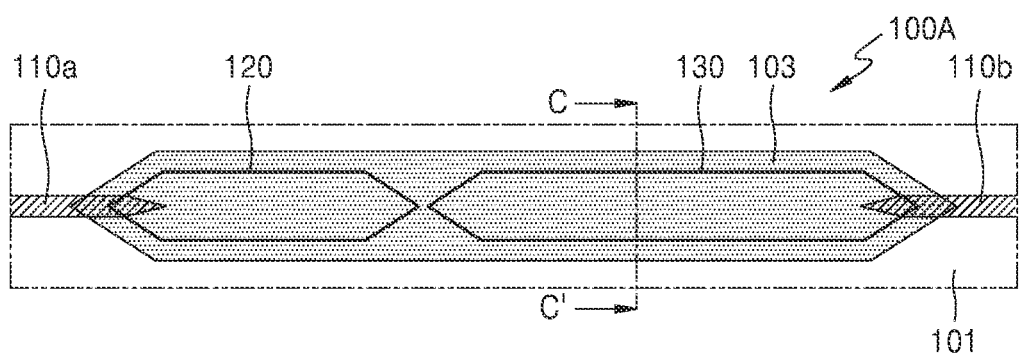
FIG. 10 is a plan view showing a configuration of an optical isolator according to another example embodiment.

As described above, light may be guided not only through the optical waveguide 110 but also through some portions of the optical attenuator 120 and the optical amplifier 130. Therefore, the optical waveguide 110 need not necessarily be extended continuously within the optical isolator 100. For example, FIG. 10 is a plan view showing a configuration of an optical isolator 100A according to another example embodiment. Referring to FIG. 10, the optical isolator 100A may include an input optical waveguide 110a and an output optical waveguide 110b discontinuously separated and spaced apart from each other. In this case, the input optical waveguide 110a includes a tapered end arranged below an optical attenuator 120, and the output optical waveguide 110b may include a tapered end arranged under an optical amplifier 130. A reflection loss and reflection noise due to a rapid material change during light traveling may be reduced by forming the ends of the input optical waveguide 110a and the output optical waveguide 110b to be tapered.

Figure 11:
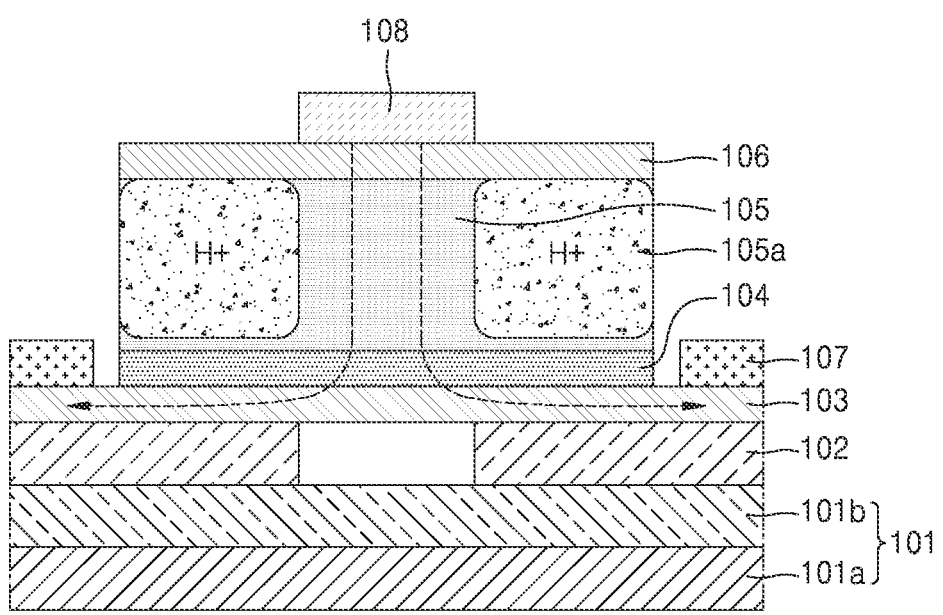
FIG. 11 is a vertical cross-sectional view of the optical isolator of FIG. 10 taken along line C-C' in FIG. 10, according to an example embodiment.

FIG. 11 is a vertical cross-sectional view of the optical isolator of FIG. 10 taken along line C-C' in FIG. 10, according to an example embodiment. Referring to FIG. 11, an optical waveguide 110 is not formed and only an empty space may exist in a region of the waveguide layer 102 facing the center of a clad semiconductor layer 105. The remaining configuration of the optical isolator 100A shown in FIGS. 10 and 11 may be the same as the configuration of the optical isolator 100 shown in FIGS. 6 and 7.

Figure 12:
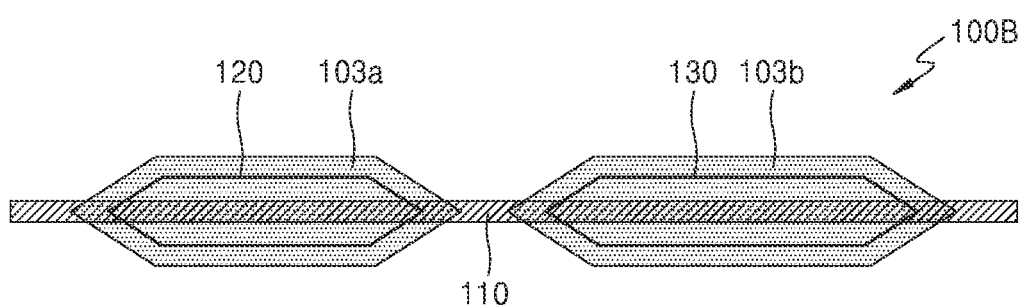
FIG. 12 is a plan view showing a configuration of an optical isolator according to another example embodiment.

In FIGS. 6 and 10, the optical attenuator 120 and the optical amplifier 130 share one first contact layer 103, but embodiments are not necessarily limited thereto. FIG. 12 is a plan view schematically showing a configuration of an optical isolator 100B according to another example embodiment. Referring to FIG. 12, the optical isolator 100B may include an optical attenuator 120 and an optical amplifier 130 arranged separately along the optical waveguide 110. The optical attenuator 120 may include a first contact layer 103a, and the optical amplifier 130 may include a second contact layer 103b separated from the first contact layer 103a. Both sides of the first contact layer 103a and both sides of the first contact layer 103b in a traveling direction of light may be formed to have tapered ends. In the example embodiment shown in FIG. 12, the first electrode 107 is not a common electrode, and the first electrode 107 may be individually arranged on the first contact layer 103a of the optical attenuator 120 and the second contact layer 103b of the optical amplifier 130.

A simulation was performed to verify the performance of the optical isolator 100 shown in FIGS. 6 and 7. It is assumed that the semiconductor layer 110a and the waveguide layer 102 of the optical isolator 100 include silicon (Si), the dielectric layer 101b includes $SiO_2$, and the optical attenuator 120 and the optical amplifier 130 include a Group III/V compound semiconductor. A total length of the optical isolator 100 in a traveling direction of light is 2 mm in which a length of the optical attenuator 120 is assumed to be 200 μm and a length of the optical amplifier 130 is assumed to be 1.8 mm. In addition, an optical confinement factor (OCF) indicating a ratio of overlapping a light mode with a gain generating unit in the optical isolator 100 is assumed to be 11.2%. A carrier density in the optical attenuator 120 is set to be 0.005 times the transparency carrier density so that the optical attenuator 120 absorbs incident light, and a carrier density in the optical amplifier 130 is set to be seven times the transparency carrier density so that the optical amplifier 130 amplifies the incident light.

Figure 13:
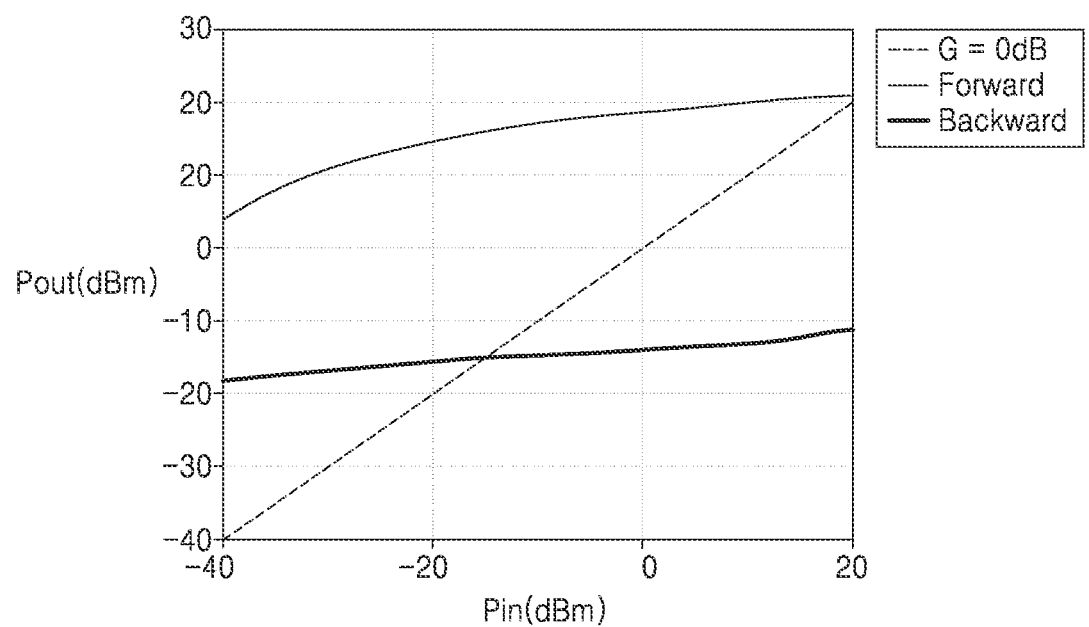
FIGS. 13, 14, and 15 are graphs showing operation characteristics of an optical isolator when noise generated in the optical isolator is not considered.
Figure 14:
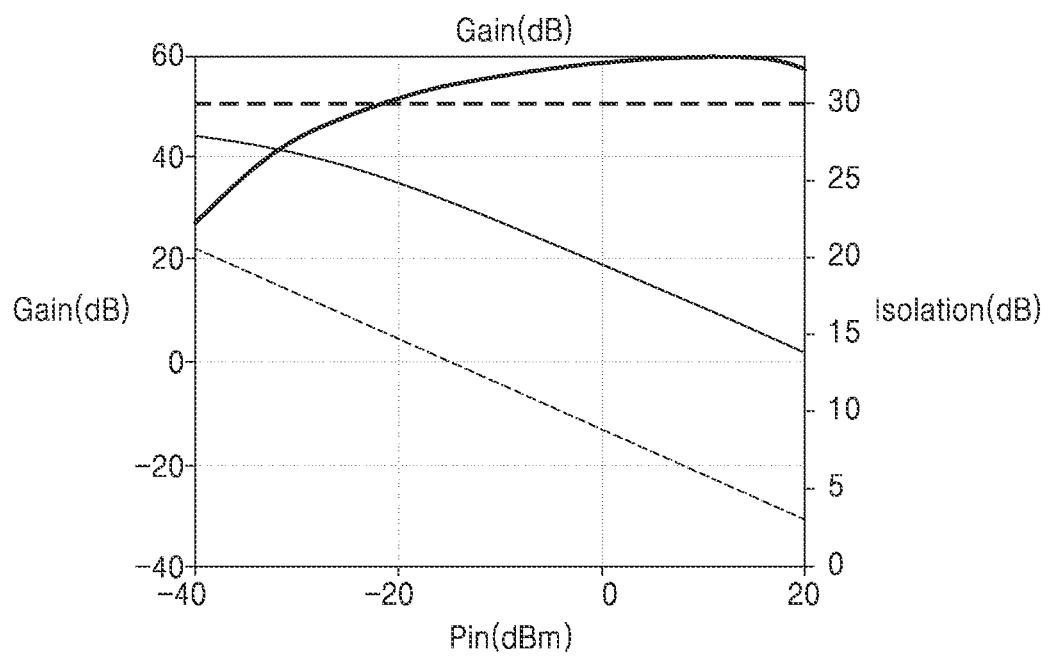
Figure 15:
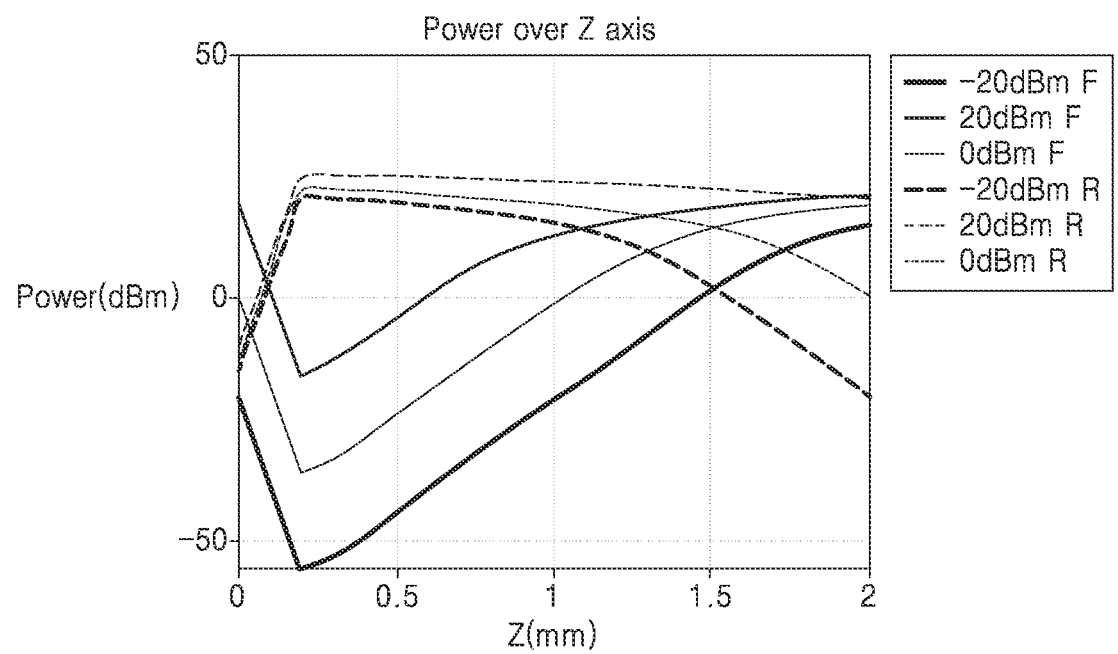
Figure 16:
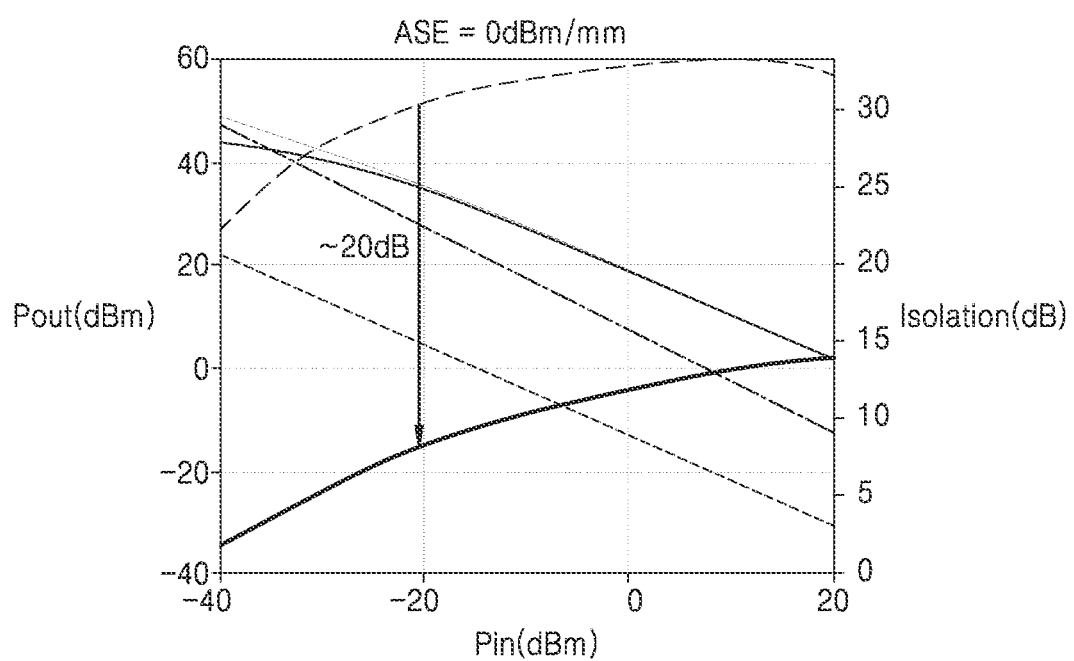
FIGS. 16, 17, 18, 19, and 20 are graphs showing simulation results of operation characteristics of an optical isolator when the intensity of noise generated in the optical isolator is variously assumed.
Figure 17:
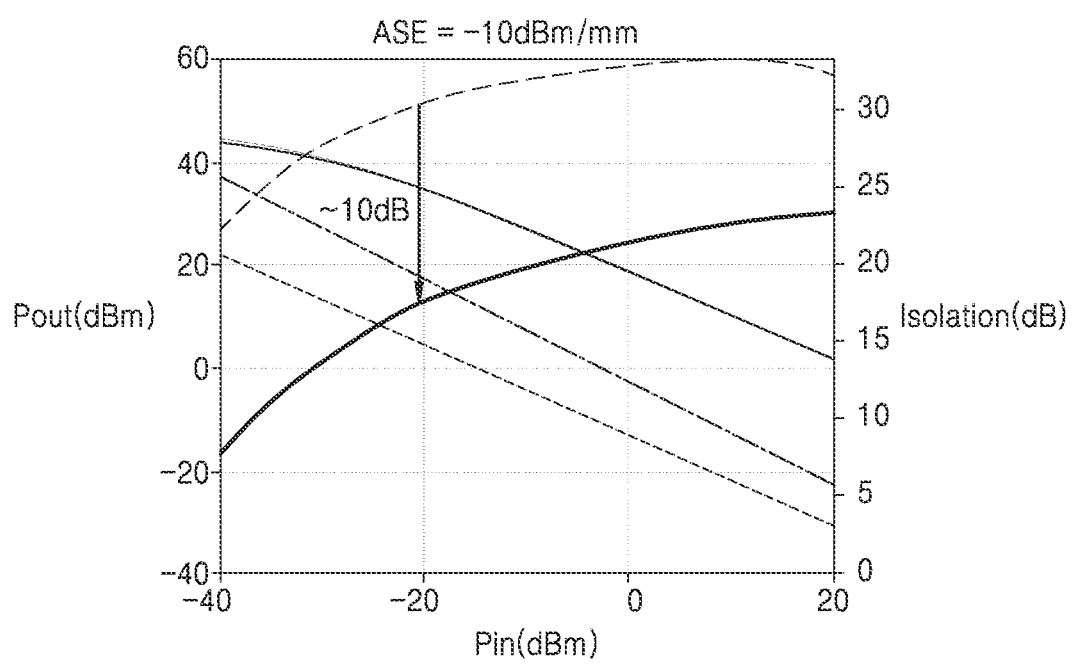
Figure 18:
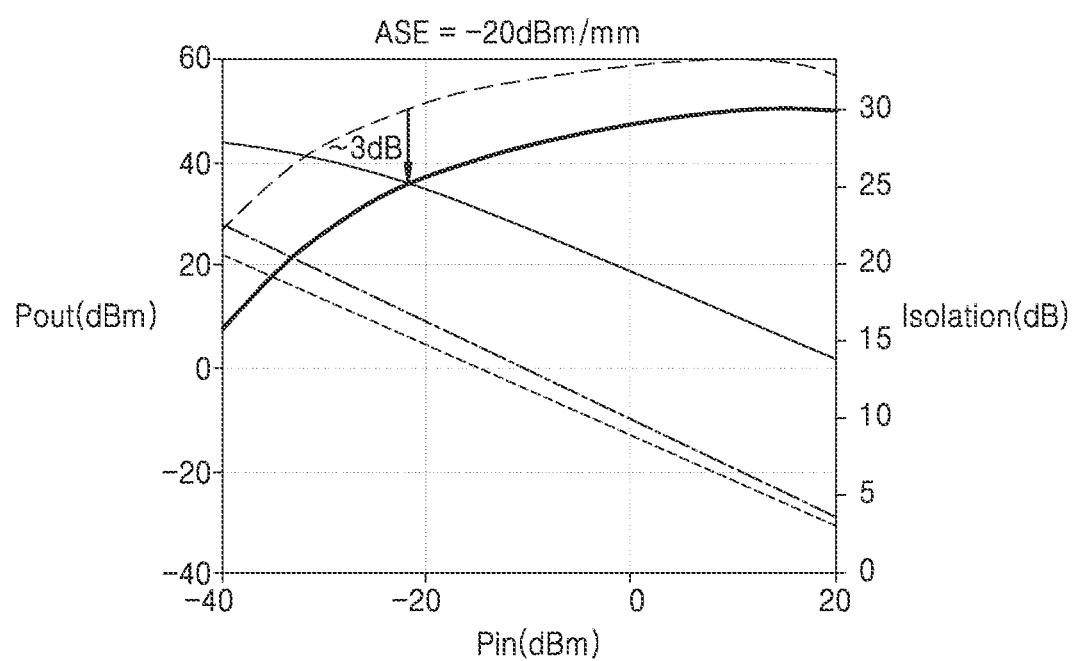
Figure 19:
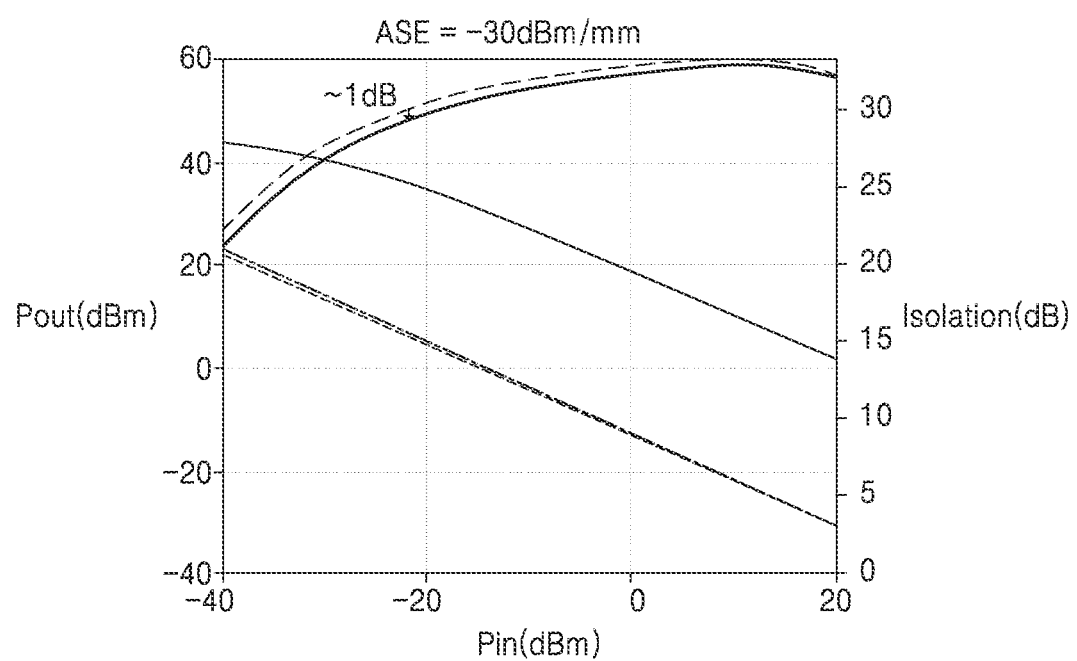
Figure 20:
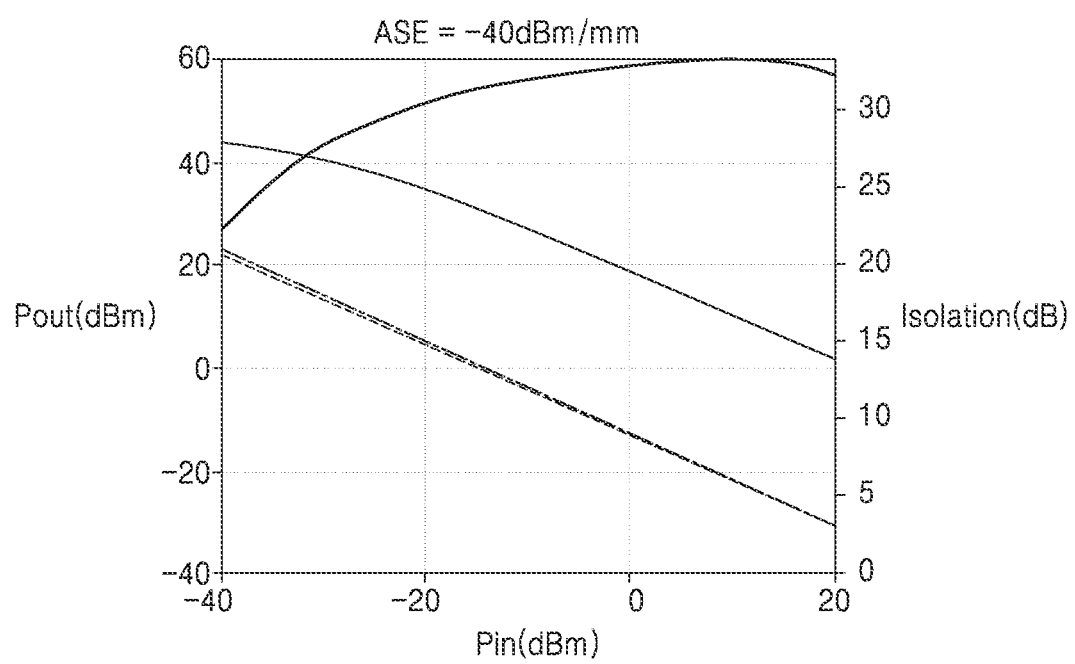

FIGS. 13 to 15 are graphs showing simulation results of operation characteristics of the optical isolator 100 when noise generated in the optical isolator 100 is not considered. The graph of FIG. 13 shows a relationship between the intensity of input light and the intensity of output light in the optical isolator 100. The dashed line indicates the relationship between the intensity of input light and the intensity of output light when a gain of the optical attenuator 120 and the optical amplifier 130 is 0 dB. In this case, the intensity of output light increases in proportion to the intensity of input light. The thick solid line indicates a relationship between the intensity of backward input light and the intensity of backward output light when a driving voltage is applied to the optical attenuator 120 and the optical amplifier 130, and a thin solid line indicates a relationship between the intensity of forward input light and the intensity of forward output light when a driving voltage is applied to the optical attenuator 120 and the optical amplifier 130. As shown in FIG. 13, the intensity of the forward output light is much greater than that of the backward output light with respect to input light of the same intensity.

The graph of FIG. 14 shows a relationship between the intensity of input light and a gain of the optical isolator 100. In FIG. 14, a thin solid line indicates a forward gain and a thin dashed line indicates a backward gain. As shown in FIG. 14, the forward gain of the optical isolator 100 is greater than the backward gain with respect to input light of the same intensity. In particular, because the optical amplifier 130 has a gain saturation characteristic, as the intensity of input light increases, the gain of the optical isolator 100 is reduced. In addition, the thick solid line in FIG. 14 represents a ratio between the intensity of forward output light and the intensity of backward output light in dB. The thick dashed line indicates a ratio between the intensity of forward output light and the intensity of backward output light required for a general optical isolator. In general, the ratio between the intensity of forward output light and the intensity of backward output light is 30 dB, that is, the intensity of forward output light is 1000 times or more greater than the intensity of backward output light with respect to input light of the same intensity, the optical isolator may be considered to have high performance. As shown in FIG. 14, the optical isolator 100 according to the example embodiment may exceed 30 dB in a wide input light intensity range of about −20 to about 20 dBm.

FIG. 15 shows an intensity change of incident light in a length direction of the optical isolator 100. In a forward direction, 0 mm is an input terminal of the optical attenuator 120, and 2 mm is an output terminal of the optical amplifier 130. Referring to FIG. 15, forward input light indicated by 'F' is attenuated first while passing through the optical attenuator 120, and then, is amplified while passing through the optical amplifier 130. Backward input light indicated by 'R' is amplified first while passing through the optical amplifier 130, and then, is attenuated while passing through the optical attenuator 120. Because the optical amplifier 130 has a gain saturation characteristic, the intensity of the backward output light may be greatly reduced regardless of the intensity of the backward input light.

As shown in FIG. 15, the intensity of forward input light may be greatly reduced by the optical attenuator 120. In this case, there is a possibility that the performance of the optical isolator 100 may be affected by noise occurred inside the optical isolator 100. FIGS. 13 to 15 are graphs showing simulation results of operating characteristics of the optical isolator 100 assuming an ideal case in which there is no noise. FIGS. 16 to 20 are graphs showing simulation results of operating characteristics of the optical isolator 100 assuming that various intensities of noise are generated in the optical isolator 100. When considering noise, in order to confirm the performance of the optical isolator 100, the simulation assumes an amount of amplified spontaneous emission (ASE) generated per 1 mm length in the optical isolator 100 is −40, −30, −20, −10, and 0 dBm.

Referring to FIGS. 16 to 20, the performance of the optical isolator 100 decreases by about 20 dB when the ASE is 0 dBm, by about 20 dB when the ASE is −10 dBm, by about 3 dB when the ASE is −20 dBm, and by about 1 dB when the ASE is −30 dBm. However, when the ASE is −40 dBm, almost no performance decline is seen. Even considering that a typical noise level of a semiconductor optical amplifier is about 20 dBm/mm, the optical isolator 100 according to the example embodiment may have a performance of 25 dB or more in a wide input light intensity range of about −20 dBm to about 20 dBm.

The results shown in FIGS. 13 to 20 are examples to illustrate the performance of the optical isolator 100 according to the example embodiments. The performance of the optical isolator 100 may further be improved by optimizing various factors, such as the type of semiconductor material used in the optical isolator 100, a cross-sectional structure and size of the optical isolator 100, a voltage applied to the optical isolator 100, the shape and size of the optical waveguide 110, lengths of the optical attenuator 120 and the optical amplifier 130, etc.

Figure 21:
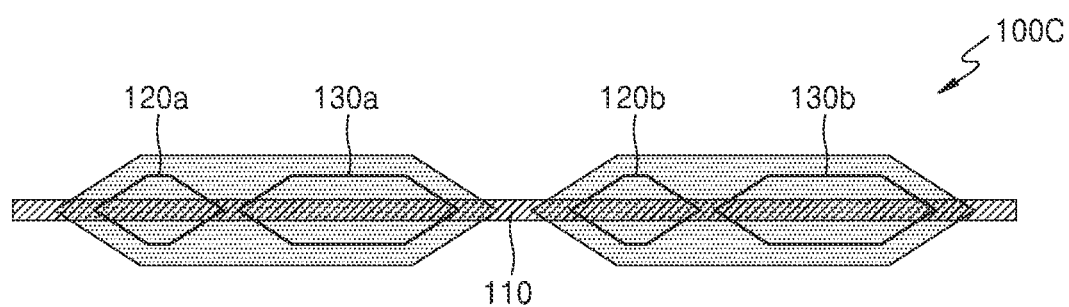
FIG. 21 is a plan view showing a configuration of an optical isolator according to another example embodiment.

FIG. 21 is a plan view showing a configuration of an optical isolator 100C according to another example embodiment. The optical isolators 100, 100A, 100B described above include one optical attenuator 120 and one optical amplifier 130, but embodiments are not necessarily limited thereto. Referring to FIG. 21, an optical attenuator of the optical isolator 100C may include a first optical attenuator 120a and a second optical attenuator 120b, and an optical amplifier of the optical isolator 100C may include a first optical amplifier 130a and a second optical amplifier 130b. The first optical attenuator 120a, the second optical attenuator 120b, the first optical amplifier 130a, and the second optical amplifier 130b may be alternately arranged in a direction of forward input light in the optical waveguide 100. For example, the first optical attenuator 120a, the first optical amplifier 130a, the second optical attenuator 120b, and the second optical amplifier 130b may be sequentially arranged in the stated order.

Accordingly, the first optical attenuator 120a and the first optical amplifier 130a may be regarded as a first optical isolator, and the second optical attenuator 120b and the second optical amplifier 130b may be regarded as a second optical isolator. In this case, it may be viewed that two optical isolators are cascade-connected. In FIG. 21, only two optical attenuators and two optical amplifiers are shown, but embodiments are not limited thereto. For example, three or more optical isolators may be cascade-connected. An attenuation rate of a plurality of optical attenuators, a gain of a plurality of optical amplifiers, an input light intensity at which gain saturation of the plurality of optical amplifiers occurs, may be differently selected.

As described above, because the optical isolator described above may be implemented with a general semiconductor material, the integration of optical isolators into a photonic integrated circuit may be possible through a general semiconductor manufacturing process. In addition, the disclosed optical isolators do not use a resonance principle, and thus, may be operated in a wide wavelength band. In addition, the disclosed optical isolator may guide light in both directions or guide light in only one direction through an electrical control. Accordingly, a function switching operation between the optical isolator and a simple waveguide is possible. For example, when a voltage is applied to the optical attenuator 120 and the optical amplifier 130 so that a carrier density in the optical attenuator 120 and the optical amplifier 130 is the same as the transparency carrier density, the optical isolator may function as a simple waveguide.

A photonic integrated circuit in which optical isolators are integrated may be applied to various application fields. For example, a bidirectional multiplexing system of an optical communication, a LiDAR apparatus, etc. may be implemented as a single photonic integrated circuit.

Figure 22:
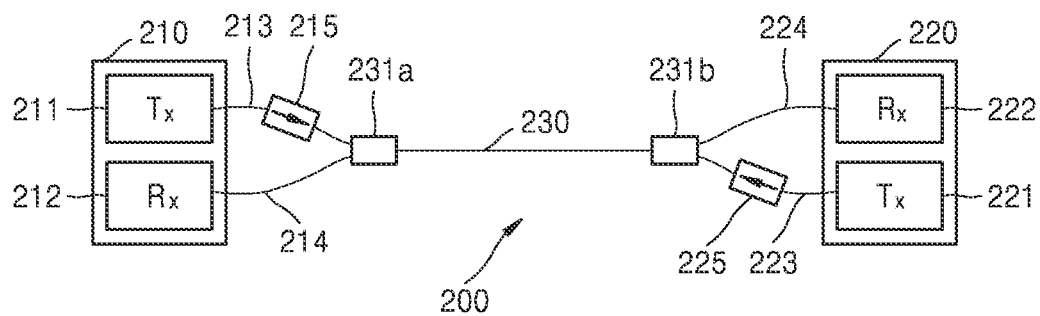
FIG. 22 is a conceptual diagram showing a bidirectional optical communication system using an optical isolator according to an example embodiment.

For example, FIG. 22 is a conceptual diagram showing a bidirectional optical communication system using optical isolators according to an example embodiment. Referring to FIG. 22, an optical communication system 200 may include a first communication terminal 210 including a first optical transmitter 211 and a first optical receiver 212, a second communication terminal 220 including a second optical transmitter 221 and a second optical receiver 222, an optical waveguide 230 that connects the first communication terminal 210 to the second communication terminal 220, and a first optical coupler 231a and a second optical coupler 231b arranged on both ends of the optical waveguide 230. The first optical coupler 231a may connect the first communication terminal 210 to the optical waveguide 230, and the second optical coupler 231b may connect the second communication terminal 220 to the optical waveguide 230.

The first communication terminal 210 may further include an optical waveguide 213 connected between the first optical transmitter 211 and the first optical coupler 231a, an optical waveguide 214 connected between the first optical receiver 212 and the first optical coupler 231a, and a first optical isolator 215 that transmits light only in a direction from the first optical transmitter 211 toward the optical waveguide 230. In addition, the second communication terminal 220 may further include an optical waveguide 223 connected between the second optical transmitter 221 and the second optical coupler 231b, an optical waveguide 224 connected between the second optical receiver 222 and the second optical coupler 231b, and a second optical isolator 225 that transmits light only in a direction from the second optical transmitter 221 towards the optical waveguide 230. The first optical isolator 215 is arranged on the optical waveguide 213, and the second optical isolator 225 may be arranged on the optical waveguide 223.

The first optical isolator 215 may allow an optical signal coming from the second communication terminal 220 through the optical waveguide 230 to proceed only to the first optical receiver 212 of the first communication terminal 210, and the second optical isolator 225 may allow an optical signal coming from the first communication terminal 210 through the optical waveguide 230 to proceed only to the second optical receiver 222 of the second communication terminal 220. The first optical isolator 215 and the second optical isolator 225 may be the optical isolators according to the example embodiments described above. By using the first optical isolator 215 and the second optical isolator 225, a bidirectional communication between the first communication terminal 210 and the second communication terminal 220 is possible with only one optical waveguide 230.

Figure 23:
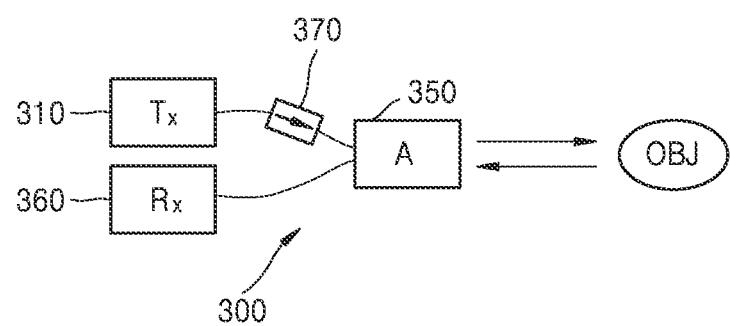
FIG. 23 is a conceptual diagram showing a light detection and ranging (LiDAR) apparatus using an optical isolator according to an example embodiment.

FIG. 23 is a conceptual diagram showing a LiDAR apparatus 300 using an optical isolator. Referring to FIG. 23, the LiDAR apparatus 300 may include a light source 310, a photodetector 360, an antenna 350 connected to the light source 310 and the photodetector 360 to emit an optical signal to the outside or to receive light from the outside, and an optical isolator 370 connected between the light source 310 and the antenna 350 to transmit light only in a direction towards the antenna 350 from the light source 310. The optical isolator 370 may be the optical isolator according to the example embodiments described above. By using the optical isolator 370, an optical signal may be emitted or received with only one antenna 350. The LiDAR apparatus 300 may be implemented as one photonic integrated circuit including an optical phase array element. Accordingly, It is possible to extract information about an external object OBJ by using the small LiDAR apparatus 300 implemented as one photonic integrated circuit.

Figure 24:
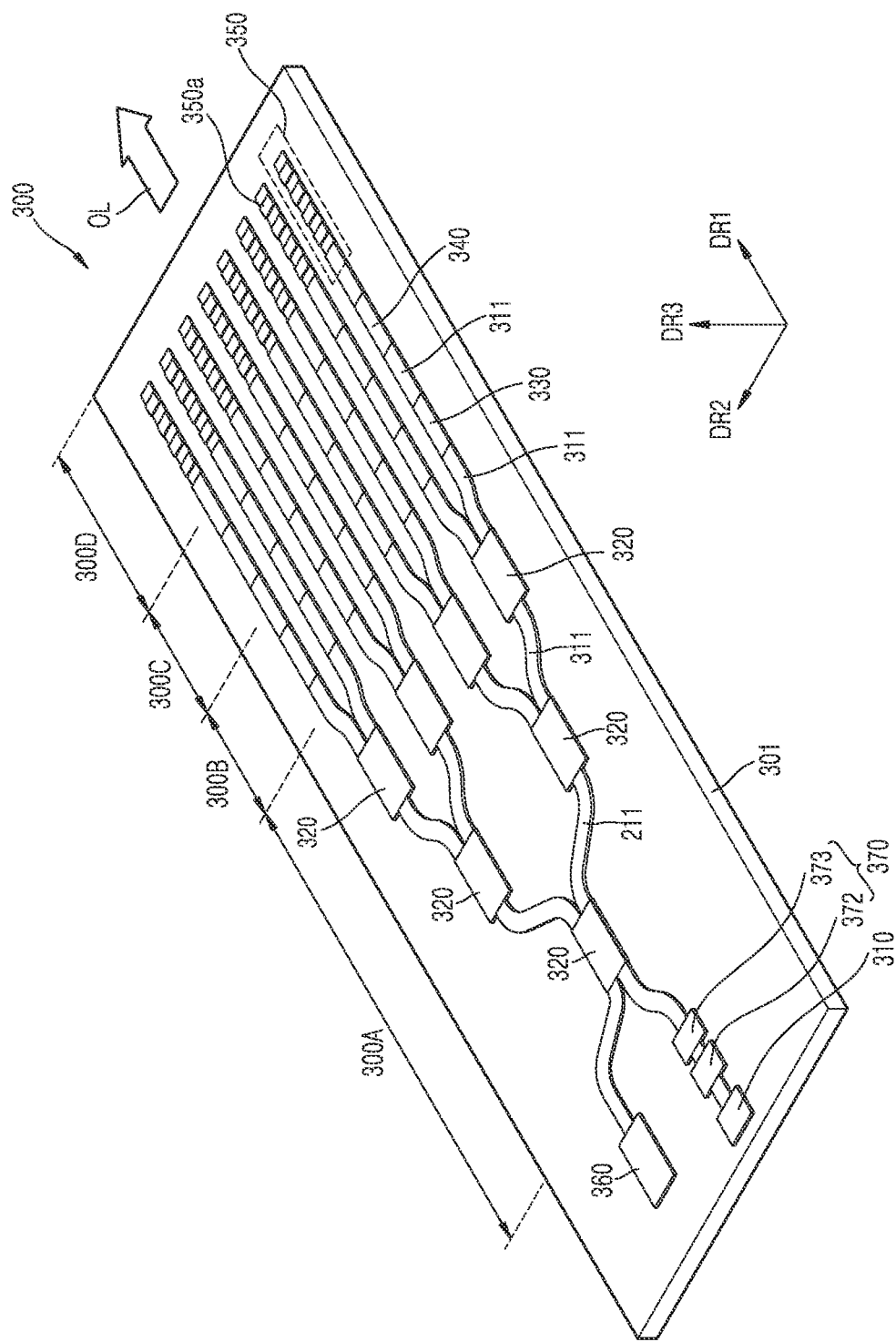
FIG. 24 is a perspective view illustrating the LiDAR apparatus shown in FIG. 23, which is implemented in one photonic integrated circuit including an optical phase array element.

For example, FIG. 24 is a perspective view illustrating the LiDAR apparatus 300 shown in FIG. 23, which is implemented in one photonic integrated circuit including an optical phase array element. Referring to FIG. 24, the LiDAR apparatus 300 may include a substrate 301, a light source 310 arranged on the substrate 301, a photodetector 360, an optical isolator 370, a branch region 300A, a phase control region 300B, an amplifying region 300C, and a transmission/reception region 300D. The light source 310, the optical isolator 370, the branch region 300A, the phase control region 300B, the amplifying region 300C, and the transmission/reception region 300D may be arranged in a first direction DR1. The LiDAR apparatus 300 may include a plurality of waveguides 311 to sequentially transmit light generated from the light source 310 to the branch region 300A, the phase control region 300B, the amplifying region 300C, and the transmission/reception region 300D. Light generated from the light source 310 may travel in the first direction DR1 through the waveguides 311.

The optical isolator 370 may be arranged between the light source 310 and the branch region 300A. The optical isolator 370 may include an optical attenuator 372 and an optical amplifier 373 arranged in the first direction DR1. The configurations of the optical attenuator 372 and the optical amplifier 373 may be the same as that of the optical attenuator 120 and the optical amplifier 130 described above.

The branch region 300A may include a plurality of splitters 320. The plurality of splitters 320 may split one light that proceeds along the waveguides 311 to several pieces of light. To this end, one of the waveguides 311 is connected to an input end of each of the splitters 320 and a plurality of waveguides 311 is connected to an output end of each of the splitters 320. As an example, a plurality of splitters 320 are shown in FIG. 15 for splitting one light into two lights. Light generated from the light source 310 may be split into a plurality of pieces of light in the branch region 300A. The split pieces of light proceed along the plurality of waveguides 311, respectively. In FIG. 24, light generated from the light source 310 is split into eight pieces of light in the branch region 300A, but embodiments are not necessarily limited thereto.

The phase control region 300B may include a plurality of phase control elements 330 respectively arranged in the plurality of waveguides 311. For example, the plurality of phase control elements 330 may be arranged in a second direction DR2 perpendicular to the first direction DR1. The plurality of pieces of light split in the branch region 300A may be respectively provided to the plurality of phase control elements 330. The phase control element 330 may have a variable refractive index that is electrically controlled. Phases of light passing through the phase control element 330 may be determined according to the refractive index of the phase control element 330. The phase control element 330 may independently control the phases of the split pieces of light.

In addition, the amplifying region 300C may include a plurality of optical amplifiers 340 respectively arranged in the plurality of waveguides 311. The plurality of optical amplifiers 340 may be arranged in the second direction DR2 perpendicular to the first direction DR1. The optical amplifiers 340 may increase the intensity of an optical signal. For example, each of the optical amplifiers 340 may include a semiconductor optical amplifier or an ion doping amplifier.

The transmission/reception region 300D may include a plurality of antennas 350. The plurality of antennas 350 may be arranged in the second direction DR2. The plurality of antennas 350 may be connected to the plurality of optical amplifiers 340, respectively. Each of the antennas 350 may emit light amplified by the amplifying region 300C, respectively. For this purpose, each of the antennas 350 may include a plurality of grating patterns 350a that is periodically arranged. The plurality of grating patterns 350a may be arranged in the first direction DR1. The traveling direction of output light OL emitted by the antennas 350 may be determined by a phase difference between split light determined in the phase control region 300B, a gap between the grating patterns 350a, a height of the grating patterns 350a, and a width of the grating patterns 350a. For example, the traveling direction of the output light OL may have a component in the first direction DR1, a component in the second direction DR2, and a component in a third direction DR3 perpendicular to the first direction DR1 and the second direction DR2.

In addition, the plurality of antennas 350 may receive an optical signal reflected from an external object OBJ. The optical signal may proceed from the plurality of antennas 350 to the transmission/reception region 300D, the amplifying region 300C, the phase control region 300B, the branch region 300A, and the photodetector 360 in the first direction DR1. Because the optical isolator 370 is arranged between the branch region 300A and the light source 310, the optical signal received by the antennas 350 may not be incident on the light source 310 but may only be incident on the photodetector 360.

Although the optical isolator and the photonic integrated circuit including the optical isolator according to the example embodiments have been described with reference to the accompanying drawings, but these are examples, and it should be understood by those skilled in the art that various changes in form and details may be made therein without departing from the spirit and scope of the present disclosure. Therefore, the example embodiments should be considered in descriptive sense only and not for purposes of limitation. Therefore, the scope of the present disclosure is defined not by the detailed description but by the appended claims, and all differences within the scope will be construed as being included.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims.

What is claimed is:

1. An optical isolator comprising:
   a waveguide layer including an input optical waveguide and an output optical waveguide;
   an optical attenuator provided on the waveguide layer, the optical attenuator being connected to the input optical waveguide; and
   an optical amplifier provided on the waveguide layer, the optical amplifier being connected to the output optical waveguide,
   wherein a gain of the optical amplifier decreases when an intensity of light incident on the optical amplifier increases,
   wherein first input light incident on the optical attenuator through the input optical waveguide is output as first output light through the output optical waveguide, and second input light incident on the optical amplifier through the output optical waveguide is output as second output light through the input optical waveguide, wherein when an intensity of the first input light and an intensity of the second input light are equal, an intensity of the first output light is greater than an intensity of the second output light, and wherein each of the optical attenuator and the optical amplifier comprises:
- a first contact layer provided on the waveguide layer;
- a gain material layer provided on the first contact layer;
- a clad semiconductor layer provided on the gain material layer; and
- a second contact layer provided on the clad semiconductor layer.

2. The optical isolator of claim 1, wherein the gain material layer includes a semiconductor material having a direct bandgap.

3. The optical isolator of claim 1, wherein a carrier density in the gain material layer of the optical attenuator is less than a transparency carrier density, and a carrier density in the gain material layer of the optical amplifier is greater than the transparency carrier density.

4. The optical isolator of claim 1, wherein the input optical waveguide and the output optical waveguide continuously extend in the waveguide layer in a traveling direction of light.

5. The optical isolator of claim 1, wherein the input optical waveguide and the output optical waveguide are spaced apart from each other,
- wherein the input optical waveguide has a tapered end provided under the optical attenuator, and
- wherein the output optical waveguide has a tapered end provided under the optical amplifier.

6. The optical isolator of claim 1, further comprising a semiconductor substrate,
- wherein waveguide layer is provided on the semiconductor substrate.

7. The optical isolator of claim 6, wherein the semiconductor substrate comprises a semiconductor layer and a dielectric layer that is provided over an entire area of an upper surface of the semiconductor layer.

8. The optical isolator of claim 6, wherein the semiconductor substrate comprises a semiconductor layer and a dielectric layer that is provided over a partial area of an upper surface of the semiconductor layer in a traveling direction of light, and
- wherein the dielectric layer faces the optical attenuator and the optical amplifier in a region between the semiconductor layer and the waveguide layer.

9. The optical isolator of claim 1, wherein the first contact layer of the optical attenuator is integrally formed with the first contact layer of the optical amplifier, and
- wherein the first contact layer of the optical attenuator and the first contact layer of the optical amplifier extend in a traveling direction of light.

10. The optical isolator of claim 9, wherein the gain material layer, the clad semiconductor layer, and the second contact layer of the optical attenuator are separated from the gain material layer, the clad semiconductor layer, and the second contact layer of the optical amplifier.

11. The optical isolator of claim 10, wherein the optical attenuator and the optical amplifier commonly comprise a first electrode provided on the first contact layer of the optical attenuator and the first contact layer of the optical amplifier, wherein the optical attenuator comprises a second electrode provided on the second contact layer of the optical attenuator, and wherein the optical amplifier comprises a second electrode provided on the second contact layer of the optical amplifier.

12. The optical isolator of claim 10, wherein lengths of the gain material layer, the clad semiconductor layer, and the second contact layer of the optical amplifier in the traveling direction of light are greater than lengths of the gain material layer, the clad semiconductor layer, and the second contact layer of the optical attenuator in the traveling direction of light.

13. The optical isolator of claim 10, wherein the gain material layer included in the optical attenuator is configured to:
- absorb light based on a backward voltage being applied to the gain material layer included in the optical attenuator; and
- amplify light based on a forward voltage being applied to the gain material layer included in the optical amplifier.

14. The optical isolator of claim 13, wherein a voltage that allows the carrier density to be less than a transparency carrier density in the gain material layer of the optical attenuator is applied to the gain material layer of the optical attenuator, and a voltage that allows the carrier density to be greater than the transparency carrier density in the gain material layer of the optical amplifier is applied to the gain material layer of the optical amplifier.

15. The optical isolator of claim 1, wherein each of the optical attenuator and the optical amplifier has a rib-type waveguide shape in which a width of the first contact layer in a direction perpendicular to a traveling direction of light is greater than widths of the gain material layer, the clad semiconductor layer, and the second contact layer.

16. The optical isolator of claim 1, wherein both sides of the first contact layer, the gain material layer, the clad semiconductor layer, and the second contact layer in a traveling direction of light have tapered ends.

17. The optical isolator of claim 1, wherein the first contact layer, the gain material layer, the clad semiconductor layer, and the second contact layer of the optical attenuator are separated from the first contact layer, the gain material layer, the clad semiconductor layer, and the second contact layer of the optical amplifier.

18. The optical isolator of claim 1, wherein the optical attenuator comprises a first optical attenuator and a second optical attenuator,
- wherein the optical amplifier comprises a first optical amplifier and a second optical amplifier, and
- wherein the first optical attenuator, the first optical amplifier, the second optical attenuator, and the second optical amplifier are arranged in order in a traveling direction of light.

19. The optical isolator of claim 1, wherein when the intensity of the first input light and the intensity of the second input light are equal, the intensity of the first output light is 1000 times or more greater than the intensity of the second output light.

20. A photonic integrated circuit comprising an optical isolator configured to integrate through a semiconductor manufacturing process, the optical isolator comprising:
- a waveguide layer including an input optical waveguide and an output optical waveguide;
- an optical attenuator provided on the waveguide layer, the optical attenuator being connected to the input optical waveguide; and an optical amplifier provided on the waveguide layer, the optical amplifier being connected to the output optical waveguide, wherein a gain of the optical amplifier decreases when an intensity of light incident on the optical amplifier increases, wherein first input light incident on the optical attenuator through the input optical waveguide is output as first output light through the output optical waveguide, and second input light incident on the optical amplifier through the output optical waveguide is output as second output light through the input optical waveguide, wherein when an intensity of the first input light and an intensity of the second input light are equal, an intensity of the first output light is greater than an intensity of the second output light, and wherein each of the optical attenuator and the optical amplifier comprises:
  a first contact layer provided on the waveguide layer;
  a gain material layer provided on the first contact layer;
  a clad semiconductor layer provided on the gain material layer; and
  a second contact layer provided on the clad semiconductor layer.

* * * * *